United States Patent [19]

Bartz

[11] Patent Number: 5,086,512
[45] Date of Patent: Feb. 4, 1992

[54] COMPENSATION SYSTEM FOR DYNAMICALLY TRACKING AND NULLING LOCAL OSCILLATOR FEEDTHROUGH

[75] Inventor: Manfred U. Bartz, Snohomish, Wash.

[73] Assignee: Hewlett-Packard Company, Palo Alto, Calif.

[21] Appl. No.: 455,209

[22] Filed: Dec. 21, 1989

Related U.S. Application Data

[63] Continuation-in-part of Ser. No. 183,856, Apr. 20, 1988, abandoned.

[51] Int. Cl.$^5$ ............................................. H04B 1/26
[52] U.S. Cl. ................................. 455/186; 455/235; 455/317; 455/226
[58] Field of Search .................. 455/317-319, 455/323, 302, 235, 185, 186, 226

[56] References Cited

U.S. PATENT DOCUMENTS

| | | | |
|---|---|---|---|
| 3,781,722 | 12/1973 | Pierson | 331/31 R |
| 3,870,960 | 3/1975 | Hallford et al. | 325/446 |
| 4,100,504 | 7/1978 | McGann | 331/39 |
| 4,325,023 | 4/1982 | Zirwick | 324/77 B |
| 4,355,420 | 10/1982 | Ishihara | 455/317 |
| 4,451,782 | 5/1984 | Ashida | 324/77 C |
| 4,654,886 | 3/1987 | Selim | 455/317 |
| 4,811,423 | 3/1989 | Eastmond | 455/235 |
| 4,850,035 | 7/1989 | Schiller | 455/109 |
| 4,918,748 | 4/1990 | Shahriary et al. | 455/316 |

FOREIGN PATENT DOCUMENTS

| | | | |
|---|---|---|---|
| 3344318 | 5/1985 | Fed. Rep. of Germany | 455/317 |
| 0025432 | 2/1984 | Japan | 455/317 |
| 0757102 | 7/1986 | U.S.S.R. | 455/317 |

Primary Examiner—Curtis Kuntz

[57] ABSTRACT

Local oscillator feedthrough in a superheterodyne receiver is eliminated by a servo loop-controlled compensation circuit that dynamically tracks the feedthrough signal and adjusts both the phase and amplitude of a compensating signal as needed to maintain the level of the feedthrough signal below a threshold value.

15 Claims, 10 Drawing Sheets

PIN DIODES    AMPLITUDE CONTROL $$V_{OUT} \propto \left[\frac{1}{R2} - \frac{1}{R1}\right]$$

$$V_{OUT} \propto \left[\frac{1}{Z2} - \frac{1}{Z1}\right]$$

$$V_{OUT} \propto \left[C1 - C2\right]$$

STAGE 1: POWER-UP PROCEDURE: PAGE 1

STAGE 2: OPTIMIZATION PROCEDURE: PAGE 2

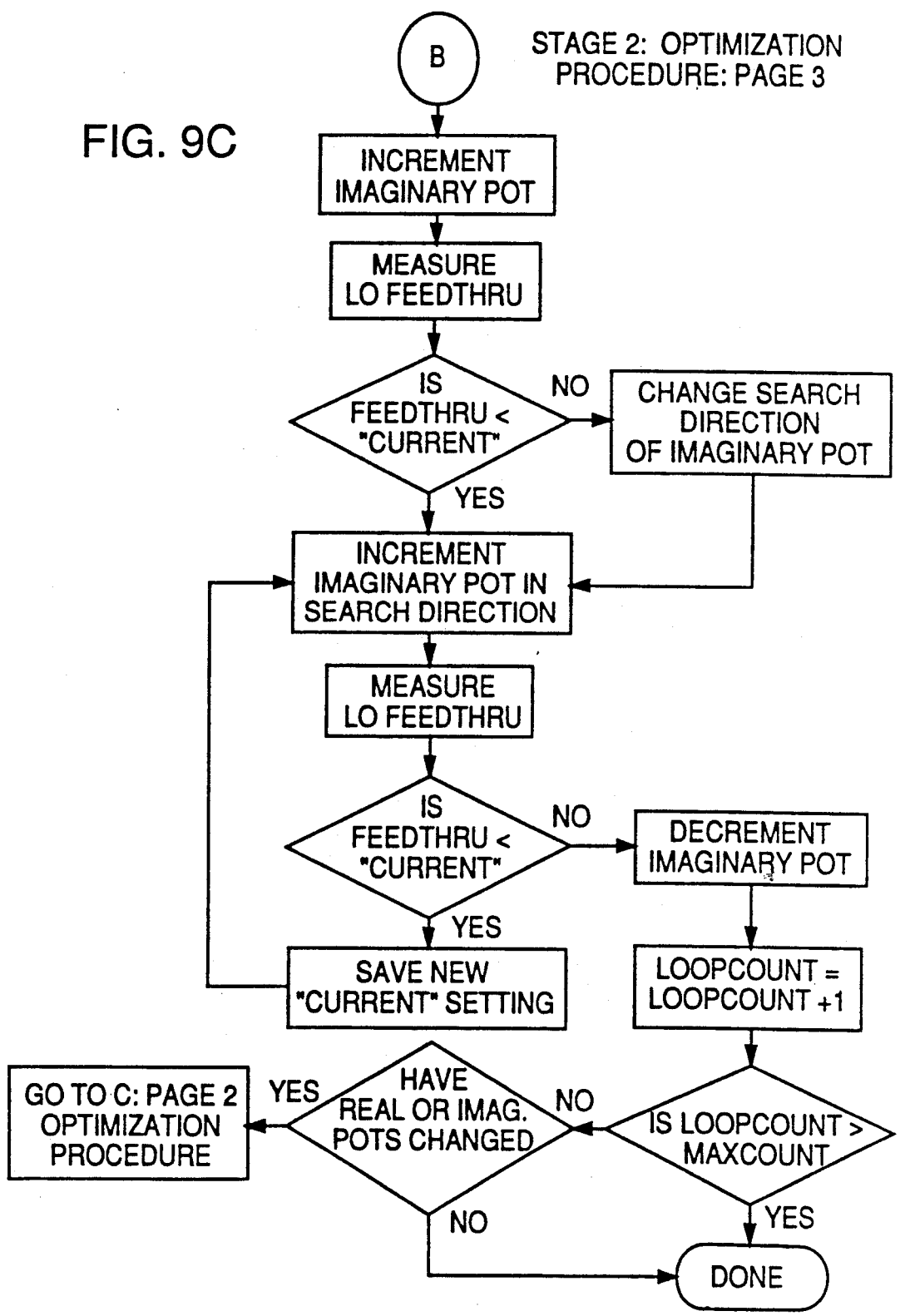

COMPENSATION SYSTEM FOR DYNAMICALLY TRACKING AND NULLING LOCAL OSCILLATOR FEEDTHROUGH

RELATED APPLICATION DATA

The present application is a continuation-in-part of application 07/183,856, filed Apr. 20, 1988 now abandoned.

TECHNICAL AREA

This invention relates to superheterodyne receivers, and more particularly to the problem of nulling local oscillator feedthrough in such receivers.

BACKGROUND OF THE INVENTION

Over the years, signal receivers have found many applications in the consumer, commercial, and industrial markets. Applications range from simple radio receivers used for receiving transmissions from local broadcast stations to receivers used in signal analyzers designed to detect and analyze one or more complex signals in the presence of other signals.

One type of signal receiver that has gained widespread acceptance is the superheterodyne receiver. In a superheterodyne receiver an incoming signal is subjected to a series of mixing and filtering steps. In a first step, or stage, of a superheterodyne receiver, an incoming signal is combined, i.e., mixed, with a locally generated signal. The source of the locally generated signal is typically an oscillator, commonly called a local oscillator. The mixed signal is filtered by an intermediate frequency (I.F.) filter that is tuned to pass a signal at a known frequency. The known frequency is either the sum of the local oscillator signal frequency and the frequency of the incoming signal, or the difference between the local oscillator signal and the frequency of the incoming signal. When the frequency of the incoming signal changes, the local oscillator signal is changed in a compensating manner such that the intermediate frequency signal remains constant.

When the incoming signal is a low frequency signal (relative to the local oscillator signal), the frequency of both the sum and difference signals discussed above are close to the frequency of the local oscillator signal. Because filters are not perfect, i.e., they do not have a sharp cut off at the ends of their designed pass band, the first stage I.F. filter of a superheterodyne receiver passes a portion of the local oscillator signal. Thus, the chosen intermediate frequency signal is distorted, i.e., contains undesired noise. For example, if the local oscillator generates a 100 MHz signal and the signal to be detected has a frequency of 100 Hz, the intermediate frequency signals resulting from superheterodyne mixing are 99.9999 MHz and 100.0001 MHz. The first stage I.F. filter, as discussed above, is tuned to pass one of these two signals. The I.F. filter has a sloped cutoff allowing frequencies close to the nominal cutoff frequency to pass through the filter, albeit at a lower amplitude. In the above example, because of the close proximity of the local oscillator frequency to the chosen intermediate frequency (100 Hz), the I.F. filter will pass a portion of the local oscillator signal. The local oscillator component of the passed signal is referred to as local oscillator feedthrough. The presence of local oscillator feedthrough distorts the first mixer stage output. Such a distortion in the output of the first stage of a superheterodyne receiver makes the analysis of the signal by subsequent stages more difficult.

Past efforts to reduce the local oscillator feedthrough have traditionally concentrated on improving the first stage mixer design and construction. Prior art improvements made in the design, layout and component specifications have resulted in low feedthrough mixers. However, the effectiveness of such prior art techniques has been limited by cost effectiveness and practical limitations associated with designing and constructing the improved circuits.

Another approach to limiting local oscillator feedthrough is to cancel the feedthrough signal by introducing a compensating signal of equal magnitude but opposite polarity into a subsequent receiver stage, as illustrated by U.S. Pat. Nos. 4,654,886 and 4,355,420, and German publication DE 3,344,318. Such approaches suffer, however, by reason of the critical adjustments that must be made in the compensating signal to effectively cancel the local oscillator feedthrough signal. As circuit parameters change with temperature and other factors, the delicate balance achieved between the two cancelling signals quickly changes, necessitating frequent adjustment to maintain satisfactory nulling performance.

From the foregoing, it will be recognized that existing solutions to the local oscillator feedthrough problem are cumbersome and ill-adapted to the demands of typical superheterodyne receiving equipment.

SUMMARY OF THE INVENTION

In accordance with the present invention, local oscillator feedthrough is eliminated by a servo loop-controlled compensation circuit that dynamically tracks the feedthrough signal and adjusts both the phase and amplitude of the compensating signal as needed to maintain the level of the feedthrough signal below a threshold value.

The foregoing and additional features and advantages of the present invention will be more readily apparent from the following description, which proceeds with reference to the accompanying drawings.

BRIEF DESCRIPTION OF THE DRAWINGS

FIGS. 9A-9C are flow charts of a procedure executed by a control microprocessor to track variations in amplitude and phase of the local oscillator feedthrough signal.

DETAILED DESCRIPTION

Figure 1:
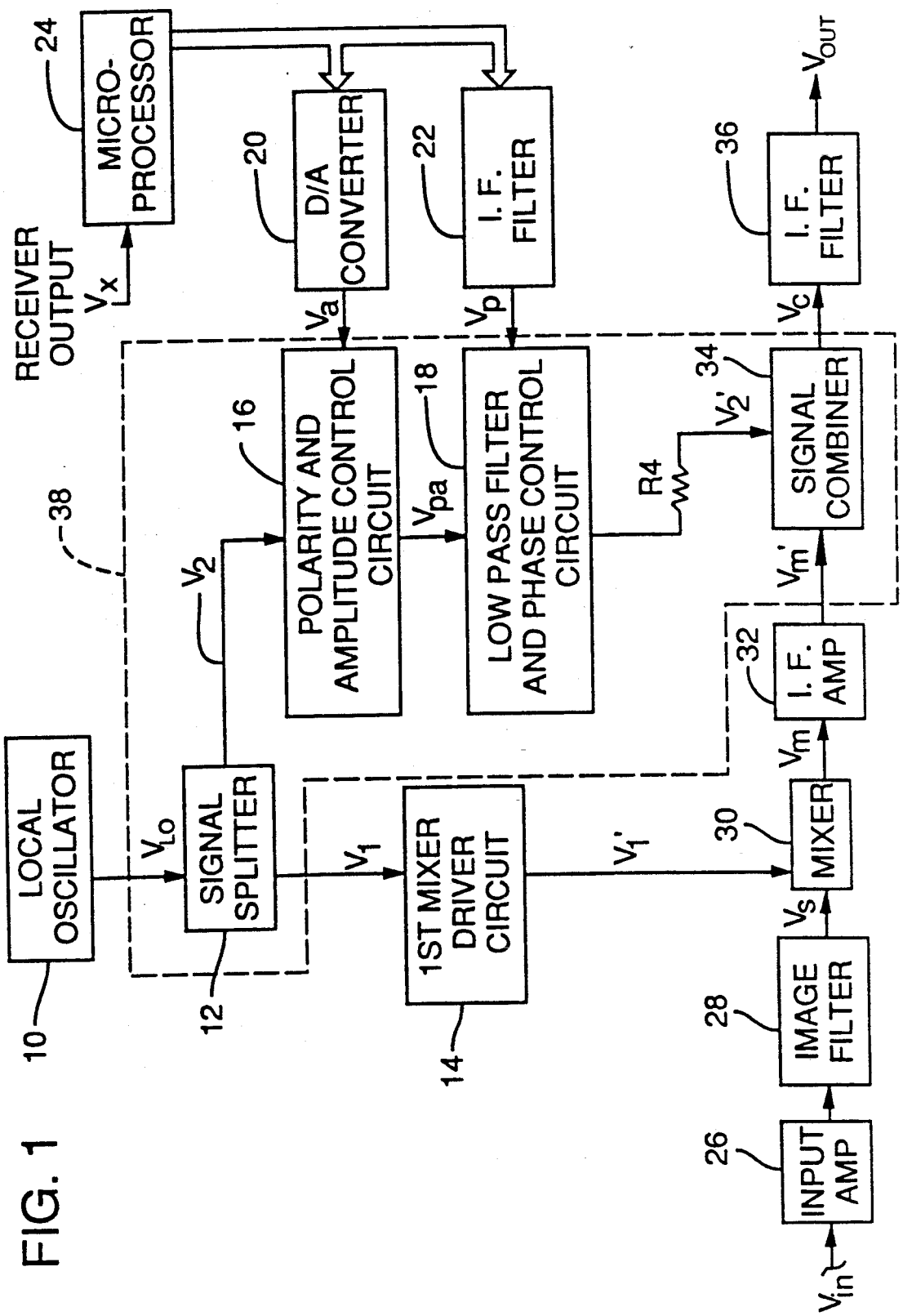
FIG. 1 is a block diagram of an apparatus in accordance with one embodiment of the present invention.

FIG. 1 illustrates in block diagram form a first mixer stage of a superheterodyne receiver in accordance with one embodiment of the present invention. A local oscillator 10 produces a signal, $V_{LO}$, which is split, by a signal splitter 12, into two equal signals, $V_1$ and $V_2$. In a conventional manner, $V_1$ is amplified by a first mixer driver circuit 14 and a resulting mixer drive signal, $V_1'$, is applied to one input of the mixer 30. An incoming signal, $V_{in}$, is amplified by an input amplifier 26 and filtered by an image filter 28 yielding a signal, $V_s$. $V_s$ is applied to a second input of the mixer 30. The $V_s$ and $V_1'$ signals are mixed in the mixer 30. The result is a mixed signal, $V_m$, which is amplified by an intermediate frequency (I.F.) amplifier 32 resulting in an amplified mixed signal, $V_m'$. In accordance with the invention, a signal combiner 34 combines $V_m'$ and a modified bypass (i.e., nullifying) signal, $V_2'$, derived from $V_2$ in a feedforward circuit 38 described in detail below. The combined signal, $V_c$, is bandpass filtered by an I.F. filter 36 to produce a first mixer stage output signal, $V_{out}$. $V_{out}$ is applied to the next stage of the superheterodyne receiver. As will be better understood from the following description, $V_2'$ reduces local oscillator feedthrough by nulling local oscillator feedthrough present in $V_m'$.

In accordance with the illustrated embodiment of the invention, the feedforward circuit 38 routes $V_2$ around mixer 30. In the FIG. 1 embodiment, $V_2$ is passed first through a polarity and amplitude control circuit 16 and then through a low-pass filter and phase control circuit 18, both of which modify $V_2$. The result of the modification is the modified bypass, or nullifying signal, $V_2'$. A microprocessor 24, operating with an associated A/D circuit and executing a digital filtering function, monitors a receiver output signal, $V_x$, to detect local oscillator feedthrough $V_1'$. If, in the absence of a $V_{in}$ signal, $V_1'$ components are detected in $V_x$, the microprocessor 24 causes the feedforward circuit 38 to modify $V_2'$ in a compensating manner. In the FIG. 1 embodiment, the microprocessor 24 sends digital signals to two digital-to-analog (D/A) converters, 20 and 22, which convert the digital signals into analog control signals, $V_a$ and $V_p$, respectively. $V_a$ is applied to the polarity and amplitude control circuit 16 and $V_p$ signal is applied to the low-pass filter and phase control circuit 18. As discussed more fully below, $V_a$ biases a pair of PIN diodes in the polarity and amplitude control circuit 16. By varying the biasing of the diode pair, the polarity and amplitude of $V_2$ is varied. The polarity and amplitude adjusted $V_2$ signal, $V_{pa}$, is applied to the low-pass filter and phase control circuit 18. As also discussed more fully below, control signal $V_p$ biases a pair of varactor diodes in the low-pass filter and phase control circuit 18. Varying the bias voltage on the diode pair causes the low-pass filter and phase control circuit 18 to phase shift $V_{pa}$, resulting in $V_2'$. Ideally, $V_2'$ has polarity, amplitude and phase characteristics such that when $V_2'$ is combined with $V_m'$, local oscillator feedthrough contained in $V_m'$ is nulled. In essence, $V_2'$ is equal in magnitude and opposite in phase with the $V_1'$ component of $V_m'$.

Figure 2:
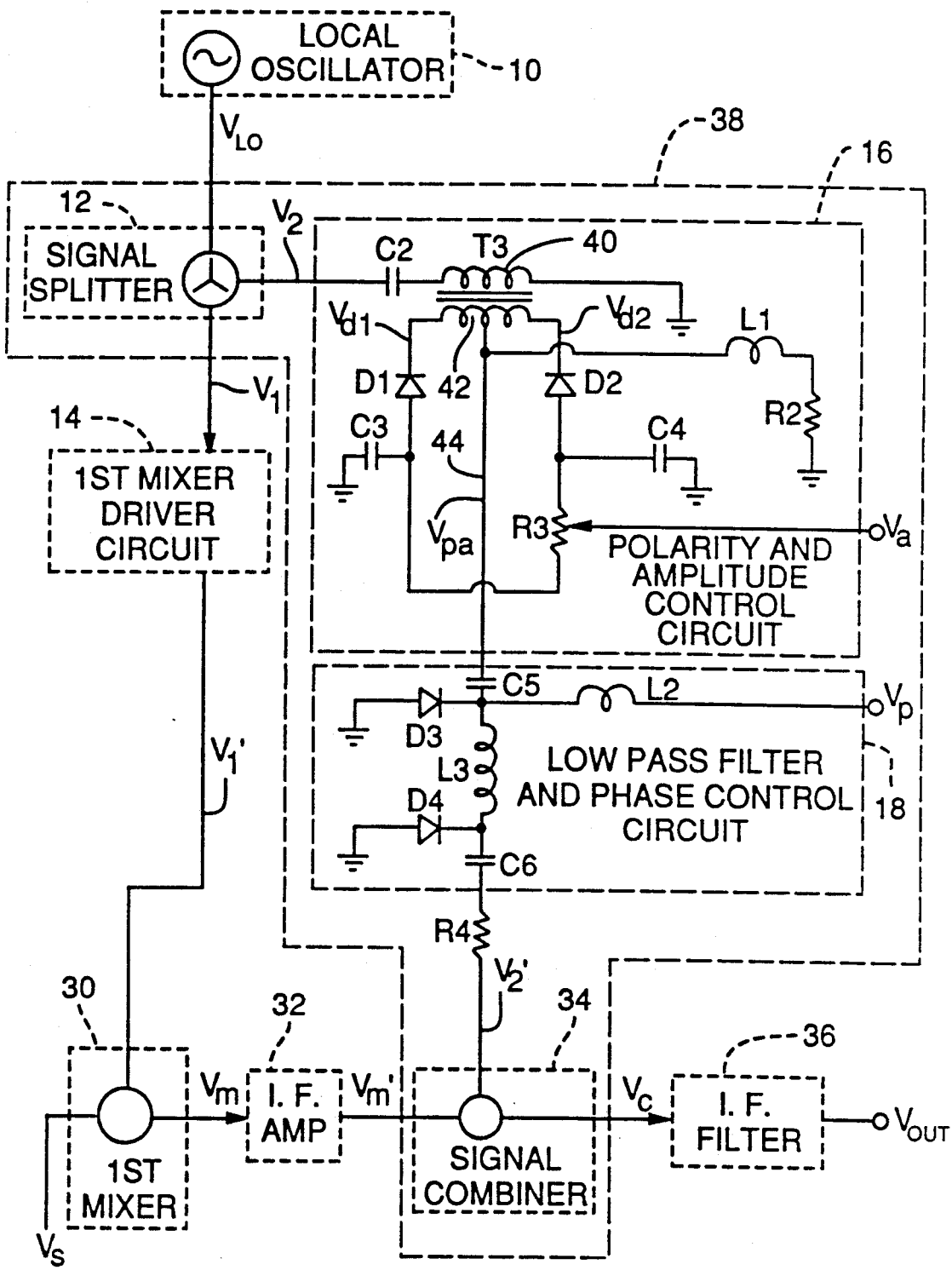
FIG. 2 is a schematic diagram of selected portions of the apparatus illustrated in FIG. 1.

One feedforward circuit 38 suitable for use in the invention is shown in FIG. 2. The feedforward circuit 38 comprises the signal splitter 12, the polarity and amplitude control circuit 16, the low-pass filter and phase control circuit 18, a 20 dB isolation pad designated R4, and the signal combiner 34. The 20 dB pad, R4, prevents the introduction of high frequency signal feedback from other parts of the receiver circuit by isolating the feedforward circuit 38 from the signal combiner 34. An example of components suitable for use as the signal splitter 12 and the signal combiner 34 in the present invention are a magic tee splitter and a magic tee combiner, respectively.

The polarity and amplitude control circuit 16 comprises three DC signal blocking capacitors designated C2, C3 and C4, a transformer designated T3 having a primary winding 40 and a center tapped secondary winding 42, two PIN diodes designated D1 and D2, a fixed resistor designated R2, a potentiometer designated R3, and an inductor designated L1. The $V_2$ output of signal splitter 12 is connected, through C2, to one end of the primary winding 40 of T3. The other end of the primary winding 40 is connected to ground. One end of the secondary winding 42 of T3 is connected to the cathode of D1, and the other end of the secondary winding 42 is connected to the cathode of D2. The anode of D1 is connected to the anode of D2 through R3. The anodes of D1 and D2 are further connected to ground through C3 and C4, respectively. One end of a center tap lead 44 is connected to the center tap of the secondary winding 42. The other end of the center tap lead 44 is connected to the low-pass filter and phase control circuit 18 in the manner hereinafter described. The center tap lead 44 is also connected to ground through the series connection of L1 and R2. L1 is a radio frequency choke that blocks r.f. frequency signals (e.g., $V_2$), while allowing lower frequency and DC signals (e.g., $V_a$) to pass through R2 to ground.

The analog (amplitude/polarity) control signal, $V_a$, is applied to the control input of the potentiometer R3 of the polarity and amplitude control circuit 16. (In practice, R3 is not included in the polarity and amplitude control circuit 16. Rather, $V_a$ is preferably a variable signal that is applied directly to the anodes of D1 and D2.)

The low-pass filter and phase control circuit 18 comprises two DC signal blocking capacitors designated C5 and C6, two varactor diodes designated D3 and D4, and two inductors designated L2 and L3. The center tap lead 44, described above, is connected to one side of C5. The other side of C5 is connected to one end of L2 and L3 and to the cathode of D3. The anode of D3 is connected to ground. The other end of L3 is connected to one side of C6 and to the cathode of D4. The anode of D4 is connected to ground. The other side of C6 is connected to the signal combiner 34 through the 20 dB pad, R4. The analog phase control signal, $V_p$, is applied to the other end of L2. In accordance with the preferred embodiment of this invention, L2 functions as a r.f. choke that blocks high frequency signals (e.g., $V_{pa}$) while passing low frequency and DC signals (e.g., $V_p$).

The critical elements related to the proper functioning of the polarity and amplitude control circuit 16 are the PIN diodes, D1 and D2. A characteristic of PIN diodes is that, in high frequency circuits, they behave like resistors. While the resistance of a PIN diode is not affected by high frequency signals, it can be adjusted by providing a variable DC bias current therethrough. PIN diode resistance is inversely proportional to the DC current flow. Thus, as a DC bias voltage applied to a PIN diode increases, the DC current flow through the PIN diode also increases. As a result, the effective PIN diode resistance, as seen by a high frequency signal, decreases. As illustrated in FIG. 2 and described above, an analog control signal, $V_a$, is applied to the anodes of D1 and D2 via R3. Thus, $V_a$ forms a DC bias voltage whose magnitude controls the DC current flow through D1 and D2 and, thus, also controls the effective high frequency resistance of D1 and D2.

In accordance with this invention, varying the $V_a$ bias voltage applied to D1 and D2 controls the polarity and amplitude of the output, $V_{pa}$, of the polarity and amplitude control circuit 16. In order to better understand how varying the $V_a$ bias voltage controls the $V_{pa}$ polarity and amplitude, three different biasing arrangements are next described. In the first, D1 and D2 are equally biased; in the second, one of D1 or D2 is fully biased (i.e., on) and the other of D1 or D2 is unbiased (i.e., off); and in the third, both D1 and D2 are biased on, but to different degrees.

Figure 3:
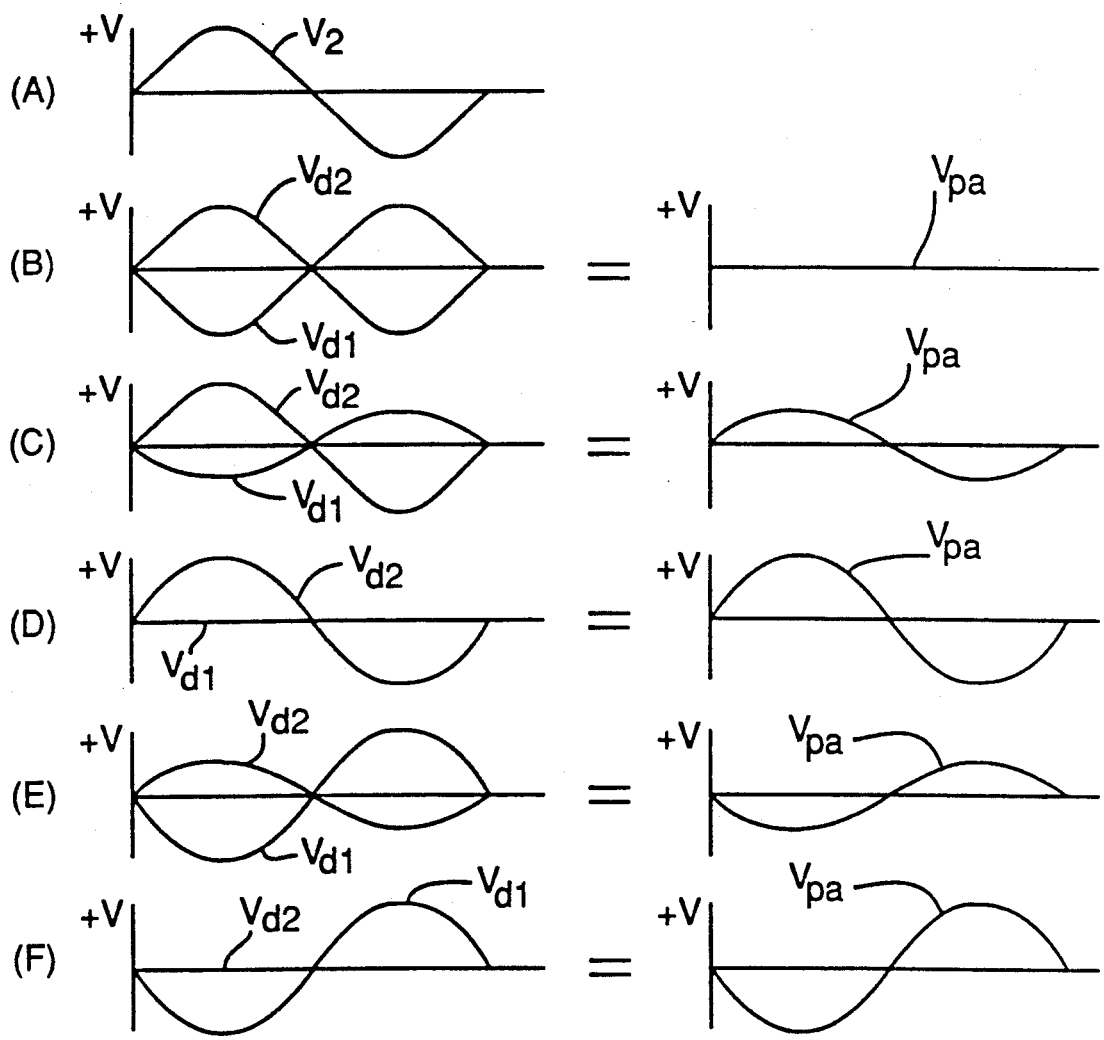
FIGS. 3(a)-(f) includes a series of waveforms illustrating the shapes of various signals as they are processed by the apparatus illustrated in FIG. 2.

Equal biasing of D1 and D2 occurs when $V_a$ is applied equally to D1 and D2 (i.e., schematically in FIG. 2, one-half of the $V_a$ signal is dropped across one side of R3, and applied to the anode of D1 and the other half of the $V_a$ signal is dropped across the other side of R3, and applied to the anode of D2). The voltage on the D1 side of the secondary winding 42 is designated the $V_{d1}$ signal and the voltage on the D2 side of the secondary winding 42 is designated the $V_{d2}$ signal. The amplitudes of $V_{d1}$ and $V_{d2}$ are equal to one another whenever D1 and D2 are equally biased because the resistances seen by $V_{d1}$ and $V_{d2}$ are equal. While the amplitudes of $V_{d1}$ and $V_{d2}$ are the same, they are opposite in polarity with respect to one another since they are derived from the opposite ends of the secondary winding 42. Thus, when D1 and D2 are equally biased, $V_{d1}$ and $V_{d2}$ cancel one another at the center tap lead 44 and the resulting $V_{pa}$ signal is zero. The above relationships between $V_{d1}$, $V_{d2}$ and $V_{pa}$ are illustrated in FIG. 3, line B.

In the second biasing arrangement mentioned above, $V_a$ is applied to only one of D1 or D2. The other of D1 or D2 is unbiased. Thus, one diode is on and the other diode is off. As a result, $V_{pa}$ is equal to either $V_{d1}$ or $V_{d2}$. For example, if D1 is biased (i.e., on) by $V_a$ and D2 is unbiased (i.e., off), D1 becomes a short circuit to ground and D2 becomes an open circuit. Because D2 is an open circuit, no $V_{d2}$ signal is produced on the D2 side of the secondary winding 42. Thus, since $V_{pa}$ is equal to the sum of $V_{d1}$ and $V_{d2}$, the resulting $V_{pa}$ signal is equal in amplitude and polarity to $V_{d1}$. This relationship is illustrated in FIG. 3, line F.

Depending upon winding direction, the polarity at one end of the secondary winding 42 is opposite to the polarity of the primary winding 40, while the polarity of the other end of the secondary winding 42 is the same as on the polarity of the primary winding 40. That is, basic transformer theory dictates that the $V_{d1}$ and $V_{d2}$ signals have opposite polarities. For purposes of this description, it is assumed that T3 is wound such that the polarity on the D1 side of the secondary winding 42 is opposite to the polarity of the primary winding 40. Thus, $V_{d1}$ is 180° out of phase with $V_2$ and, $V_{d2}$ is in phase with $V_2$. As a result, in the above example, $V_{pa}$ has the opposite polarity of $V_2$. This is illustrated in FIG. 3, lines A and F. If the situation in the above example is reversed; namely, D1 is unbiased and D2 is biased by $V_a$, $V_{pa}$ is equal in amplitude and polarity to $V_{d2}$, because there is no $V_{d1}$ signal. Because the polarity on the D2 side of the secondary winding 42 is the same as on the primary winding 40, $V_{pa}$ has the same polarity as $V_2$. This relationship is illustrated in FIG. 3, lines A and D. In summary, by biasing only one of D1 or D2 it is possible to produce a $V_{pa}$ signal that is equal in amplitude to, and in phase with, $V_{d1}$ or $V_{d2}$; and has either the same or opposite polarity as $V_2$. The importance of having the flexibility to produce a $V_{pa}$ signal having either the same or opposite polarity as $V_2$ is discussed next.

When the mixer 30 mixes $V_s$ with $V_1'$, it may or may not reverse the polarity of $V_1'$. Such a polarity reversal by mixer 30 is dependent upon the mixer design and construction. For example, a component mismatch in the four diode ring of the mixer 30 will cause a phase shift in the $V_1'$ components of between 0°-360°. Obviously, a 180° phase shift amounts to a polarity reversal of the $V_1'$ component. Therefore, the feedforward circuit 38 must be capable of reversing the polarity of $V_2'$ so that $V_2'$ can oppose the $V_1'$ components of the $V_m'$ signal. The feedforward circuit 38 accomplishes the polarity reversal of $V_2'$ in the manner described above.

The third biasing arrangement of D1 and D2, namely unequal biasing of both D1 and D2, is discussed next. Unequal biasing of D1 and D2 results in unequal resistance values of D1 and D2. The unequal resistances of D1 and D2 results in unequal amplitudes of the $V_{d1}$ and $V_{d2}$ signals. Because $V_{d1}$ and $V_{d2}$ have opposite polarities, as discussed above, combining $V_{d1}$ and $V_{d2}$ results in incomplete cancellation of the two signals. The resulting $V_{pa}$ signal will have a polarity equal to the polarity of either $V_{d1}$ or $V_{d2}$, determined by whichever signal has the greater amplitude. The amplitude of $V_{pa}$ will be equal to the difference between the amplitudes of $V_{d1}$ and $V_{d2}$. This relationship can be seen by comparing the waveforms depicted in FIG. 3, lines C and E. For example, if less biasing voltage (i.e., $V_a$) is applied to D1 than is applied to D2, D1, will have a higher resistance than D2. As a result, the amplitude of $V_{d1}$ will be less than the amplitude of $V_{d2}$. The resulting $V_{pa}$ signal will be in-phase with $V_{d2}$ (since $V_2 > V_{d1}$) and the amplitude of $V_{pa}$ will equal the amplitude of $V_{d2}$ reduced by the amplitude of $V_{d1}$. See FIG. 3, line C. Obviously, if the biasing of D1 and D2 is reversed, $V_{pa}$ will be less than, but in-phase with, $V_{d1}$. See FIG. 3, line E. Thus, unequal biasing of D1 and D2 provides both polarity and amplitude control of $V_{pa}$. The importance of polarity control was discussed above. The importance of amplitude control of $V_{pa}$ is discussed next.

In general, the amount of local oscillator feedthrough (i.e., the $V_1'$ component of $V_m$) is a function of the $V_{LO}$ signal frequency, the $V_s$ signal frequency, the inability of imperfect mixers to reject the local oscillator feedthrough and the design of the I.F. filter 36. As stated above, since no filters are perfect, some signals near the filter pass band cutoff are passed. Introducing amplitude control in the polarity and amplitude control circuit 16, allows the amplitude of the $V_{pa}$ signal to be adjusted to equal the amplitude of the $V_a'$ component of the $V_m'$ signal.

As a result of the aforementioned polarity and amplitude adjustments to $V_{pa}$, the polarity and amplitude control circuit 16 causes a slight phase shift in $V_{pa}$. The phase shift is inherent in the operation of the D1 and D2 configuration described above. In accordance with this invention, the phase difference between $V_{pa}$ and the $V_1'$ component of $V_m'$ is corrected by the low-pass filter and phase control circuit 18, whose operation is described next.

The key elements of the low-pass filter and phase control circuit 18 are the varactor diodes D3 and D4. As will be discussed below, D3 and D4 combine with L3 to form a tunable low-pass filter. Varactor diodes have a capacitance value that varies as a function of the bias voltage applied to their cathodes. Thus, in the preferred embodiment of the invention, the capacitance of D3 and D4 can be varied by varying the $V_p$ signal. Varying the capacitance of D3 and D4 tunes the low-pass filter by moving the corner frequency (i.e., high frequency cutoff) of the low-pass filter and phase control circuit 18. As will be described below, moving the corner frequency provides phase shift control in the low-pass filter and phase control circuit 18.

It is well-known in the filtering art that filtered signals are subjected to increasing amounts of phase shift as the frequency of the filtered signal approaches the corner frequency of a filter. It follows that the degree of phase shift applied to a signal can be controlled by controlling the location of the corner frequency of the filter. In the present invention, this phenomenon is used to control the phase shifting of $V_{pa}$ signals. More specifically, the corner frequency of the low-pass filter and phase control circuit 18 is moved to control the phase shifting of $V_{pa}$ signals. The degree to which the corner frequency is moved is determined by the amount of phase shift desired, which, in turn, is controlled by the magnitude of $V_p$. As detailed below, the microprocessor 24 adjusts $V_p$ so that the $V_{pa}$ phase shift created by the low-pass filter and phase control circuit 18 will compensate for the phase difference between $V_{pa}$ and the $V_1'$ component contained in $V_m'$.

Phase shifting $V_{pa}$ in the manner described above results in a slight amplitude change in $V_{pa}$. In accordance with the preferred embodiment of the invention, the amplitude change introduced by the low-pass filter and phase control circuit 18 is compensated for by the polarity and amplitude control circuit 16. More specifically, as discussed more fully below, the microprocessor 24 detects the changed amplitude of the $V_{pa}$ signal by detecting a changed local oscillator feed through signal after $V_p$ has been varied to change the phase shift created by the low-pass filter and phase control circuit. When this occurs, the microprocessor 24 issues control signals (via $V_a$) to the polarity and amplitude control circuit 16 that causes a compensating change in the amplitude of $V_{pa}$.

As detailed more fully below, the microprocessor 24 monitors the local oscillator feedthrough (i.e., $V_1'$ component) in the output signal, $V_x$, of the superheterodyne receiver. The microprocessor 24 measures the $V_1'$ component during a calibration phase, which typically occurs when the instrument is powered on. Alternatively, or in addition, the calibration phase may be initiated by a user via a keyboard entry to the microprocessor 24. Likewise, an automatic calibration feature may reinitiate the calibration phase periodically. During the calibration phase, the microprocessor 24 tunes the local oscillator 10 to the center frequency of the first stage I.F. filter 36. In accordance with the preferred embodiment of the invention, this tuned local oscillator frequency (i.e., $V_{LO}$) corresponds to a 0 Hz $V_{in}$ signal. During the calibration phase a suitable means for blocking the $V_{in}$ signal is implemented. An example of such a blocking means is a relay switch that open-circuits the appropriate inputs to the mixer 30. Hence, during the calibration phase, the $V_x$ signal consists entirely of the $V_1'$ component of $V_m'$. The microprocessor 24 determines the magnitude of the $V_1'$ component and uses the magnitude information to control the feedforward circuit 38 in the manner described next.

The microprocessor 24 next applies an iterative and interactive control algorithm (detailed more fully below) to control the feedforward circuit 38. Having once determined the amount of the $V_1'$ component that is to be nulled, as discussed above, the microprocessor 24 will vary $V_a$, i.e., $V_a$ will be increased or decreased. The polarity and amplitude control circuit 16 will respond to the varied $V_a$ signal and adjust the amplitude of $V_{pa}$ in the manner described above. After $V_{pa}$ has been adjusted, the microprocessor 24 will look for a change in the $V_1'$ component of $V_x$. If a reduction in the $V_1'$ component is detected, $V_a$ will be varied in the same direction (i.e., increased or decreased.) This process will be repeated until the $V_1'$ component is minimized. Alternatively, if the $V_1'$ component increases, when $V_a$ is first varied, the next $V_a$ change will be in the opposite direction, e.g., $V_a$ will be decreased if it was increased or increased if it was decreased. This is the iterative aspect of the control algorithm used by the microprocessor 24 and is equally applicable to the microprocessor 24 adjustments to $V_p$. Either after the $V_1'$ component has been minimized by changing $V_a$, or after each change in $V_a$, the microprocessor 24 will change $V_p$ and detect its effect on the $V_1'$ component of $V_m'$. As with $V_a$ changes, $V_p$ changes will take place until $V_p$ changes have no further effect on the magnitude of the $V_1'$ component, or the $V_1'$ component magnitude drops below an acceptable value. If the $V_1'$ component is not below an acceptable value, $V_a$ will be changed to see if a lower $V_1'$ component value can be achieved. The back and forth shift between $V_a$ and $V_p$ changes continues until the $V_1'$ value drops below an acceptable level. The back and forth shift between $V_a$ and $V_p$ changes is the interactive feature of the microprocessor control algorithm. The minimized local oscillator feedthrough value is preferably preset by a manufacturer of the invention.

The foregoing description of the operation of microprocessor 24 is expanded in the following discussion, which deals with certain improvements to the feed forward circuitry.

Alternative Embodiment

In an alternative embodiment, the feed forward circuitry 38 detailed above may be modified to yield simplified independent control of the real and imaginary components of the compensating feed forward signal.

Figure 4:
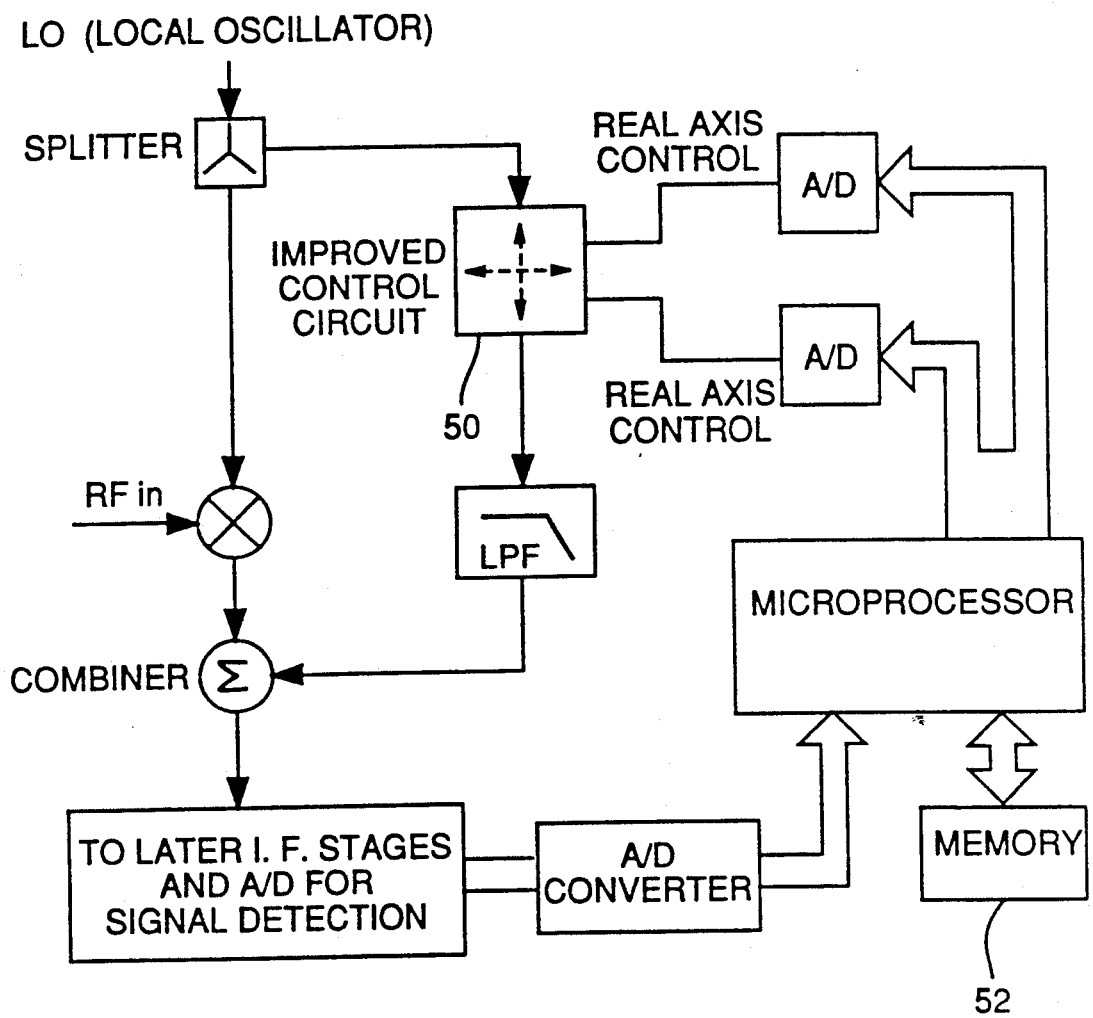
FIG. 4 is a block diagram of an automatic control loop for a superheterodyne receiver, similar to that shown in FIG. 1.

Referring first to FIG. 4, there is shown a block diagram of an automatic control loop for a superheterodyne receiver, similar to that shown in FIG. 1. In the FIG. 4 diagram, however, control of the compensating signal's phase, amplitude and polarity is effected by a single control circuit 50, instead of the two circuits 16, 18 shown in FIG. 1.

FIG. 5 details the derivation of the improved control circuit 50 from the amplitude control circuit 16 discussed earlier. FIG. 5A shows the basic amplitude control circuit of FIG. 2, which uses two PIN diodes D1, D2. FIG. 5B generalizes this circuit by substituting resistors for the PIN diodes. Both FIGS. 5A and 5B provide amplitude (i.e. real axis) control of the compensating signal, as depicted by the polar plot of FIG. 6A.

Figure 5A:
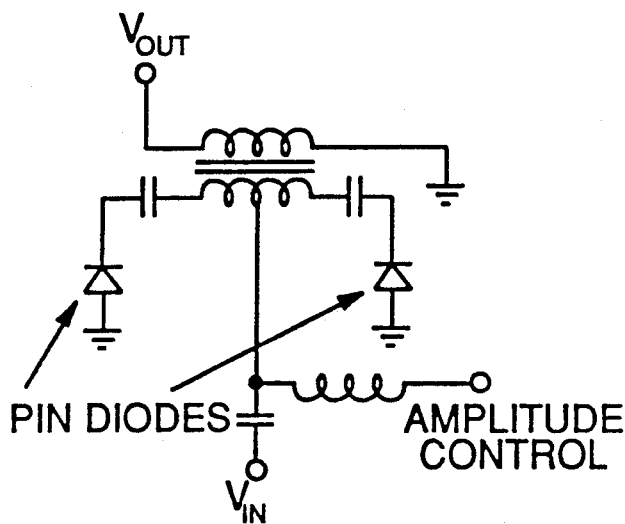
FIGS. 5(a)-(d) details the derivation of an improved control circuit.
Figure 5B:
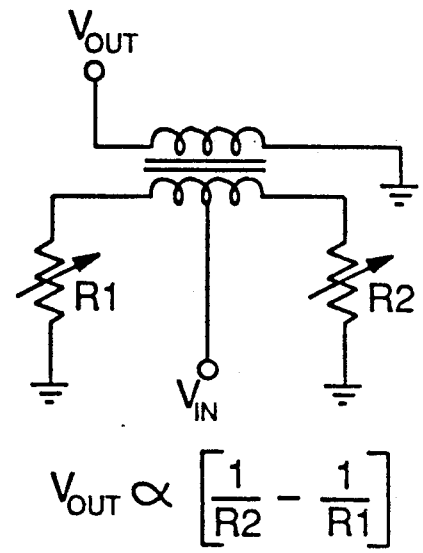
Figure 5C:
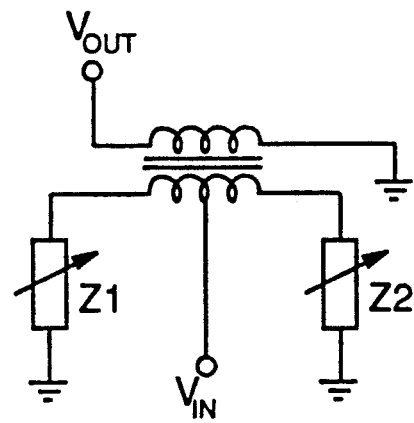
Figure 5D:
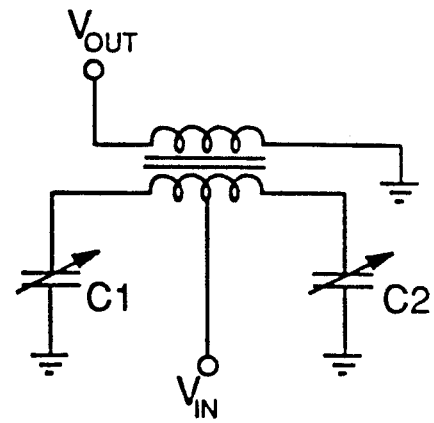
Figure 6A:
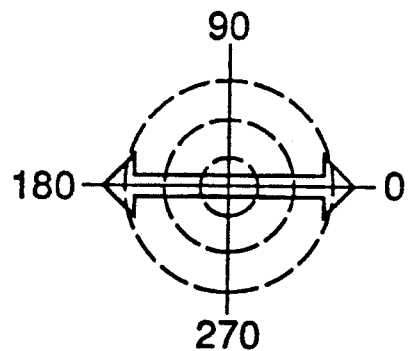
FIGS. 6A and 6B are polar plots exhibiting ranges of real and imaginary control over the compensating signal.
Figure 6B:
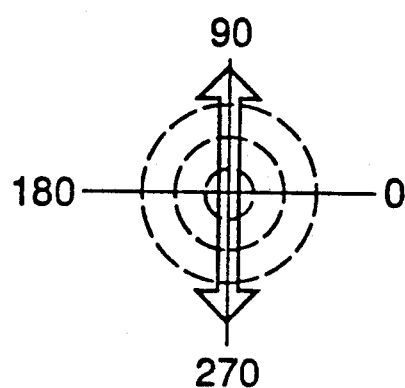

A further generalization, involving the substitution of variable impedances for the variable resistances, is shown in FIG. 5B. This substitution yields a circuit that provides a broad range of both phase and amplitude control, with a transfer function proportional to the differences between the admittances. FIG. 5D shows yet another substitution, this one using variable capacitances to achieve phase (i.e. imaginary axis) control of the compensating signal. FIG. 6B is a polar plot illustrating the range of phase control possible by using a reactive element-based control circuit.

Figure 7:
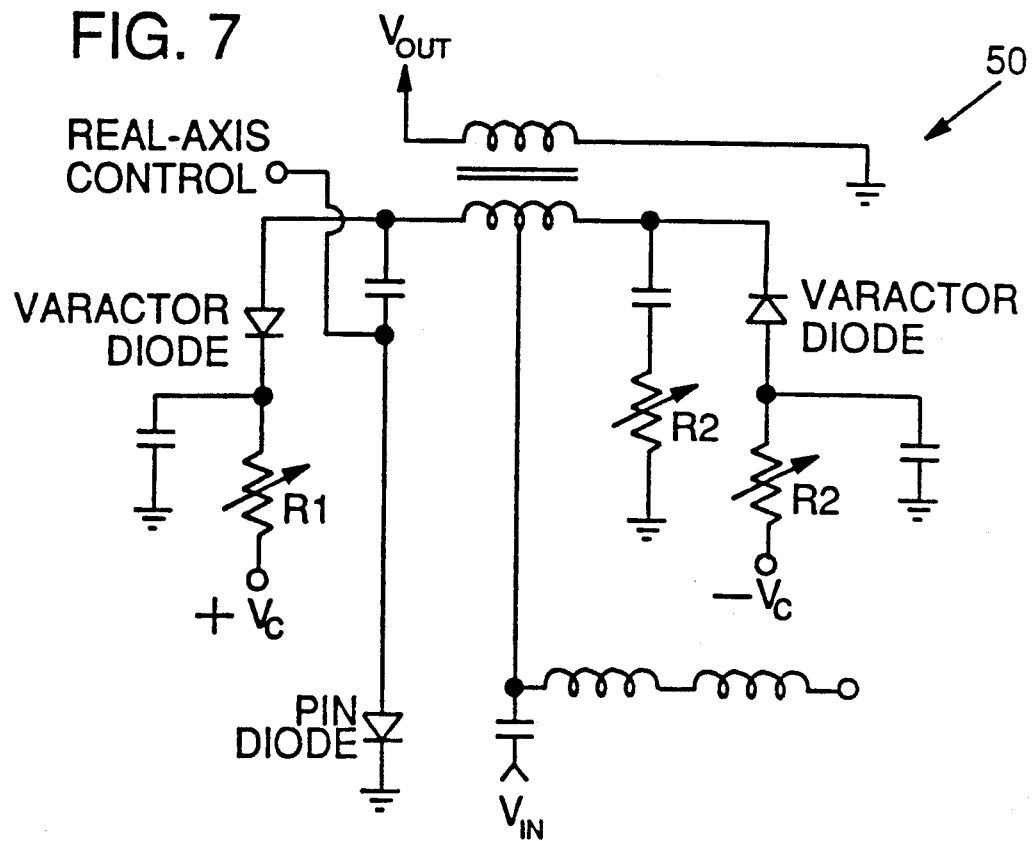
FIG. 7 is a schematic diagram of an improved control circuit.
Figure 8A:
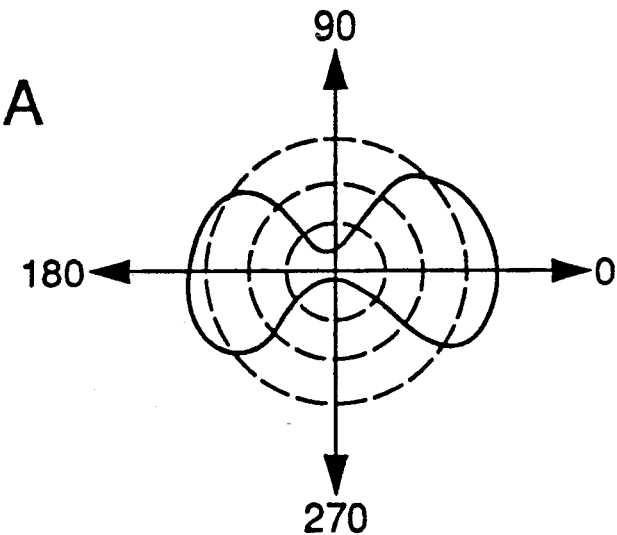
FIGS. 8A and 8B are polar plots illustrating the range of amplitude and phase control available over the compensating signal using the circuits of FIGS. 2 and 7, respectively.
Figure 8B:
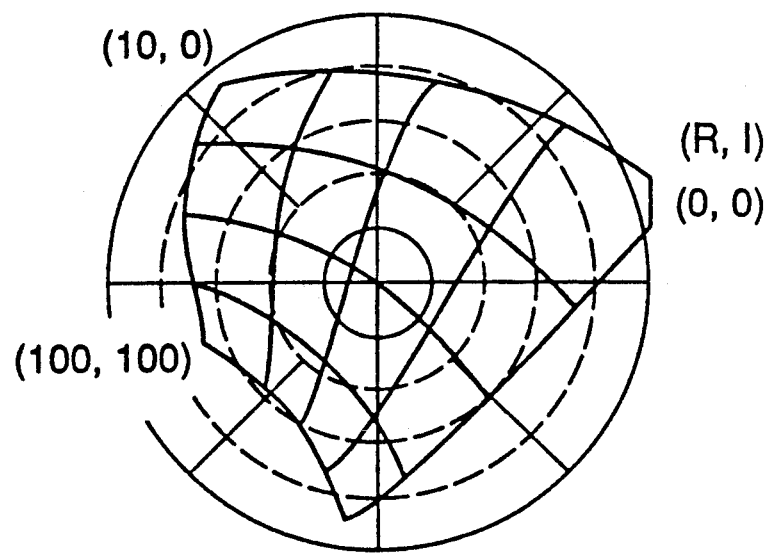

It will be recalled that a variable capacitance effect can be achieved by adjustably biasing a varactor diode. By incorporating a varactor diode-based version of the phase control circuit of FIG. 5D into the PIN diode-based amplitude control circuit 16 of FIG. 2, an efficient phase and amplitude control circuit can be realized. The improved design, shown in FIG. 7, also exhibits much better phase coverage than the original functionally separate phase control circuit 18 of FIG. 2. This improved coverage is illustrated by polar plots depicting the amplitude and phase coverage for both the original and improved circuits in FIG. 8.

The earlier-described control circuits 16, 18 provided two independent controls of phase and amplitude by which the microprocessor 24 could achieve an optimum null of the local oscillator feedthrough. The improved combination control circuit shown in FIG. 7 also has two corresponding independent controls for real and imaginary axes. The software procedure described below which automatically implements the local oscillator feedthrough nulling operates with either the original or this improved circuit.

Figure 9A:
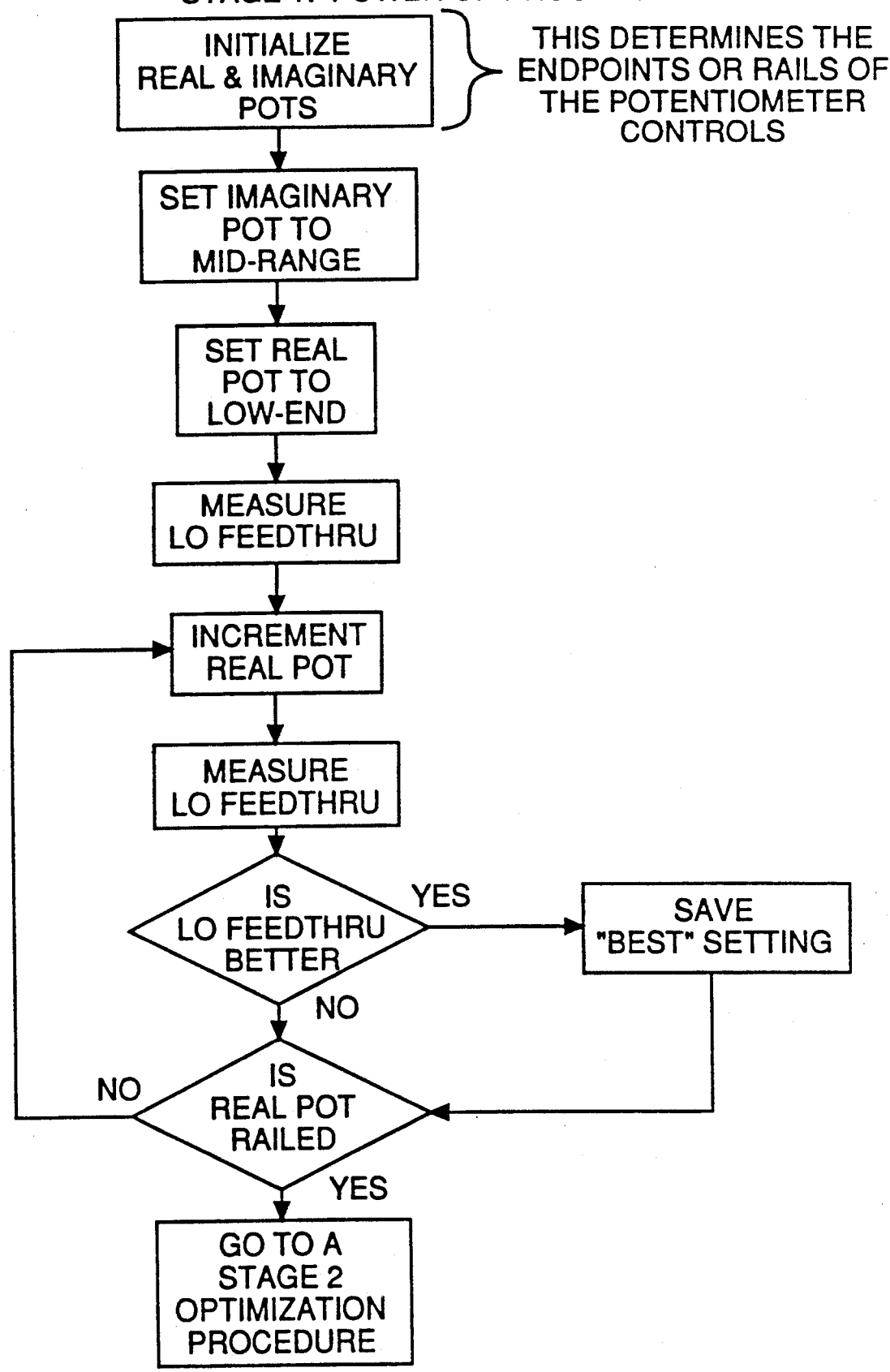
Figure 9B:
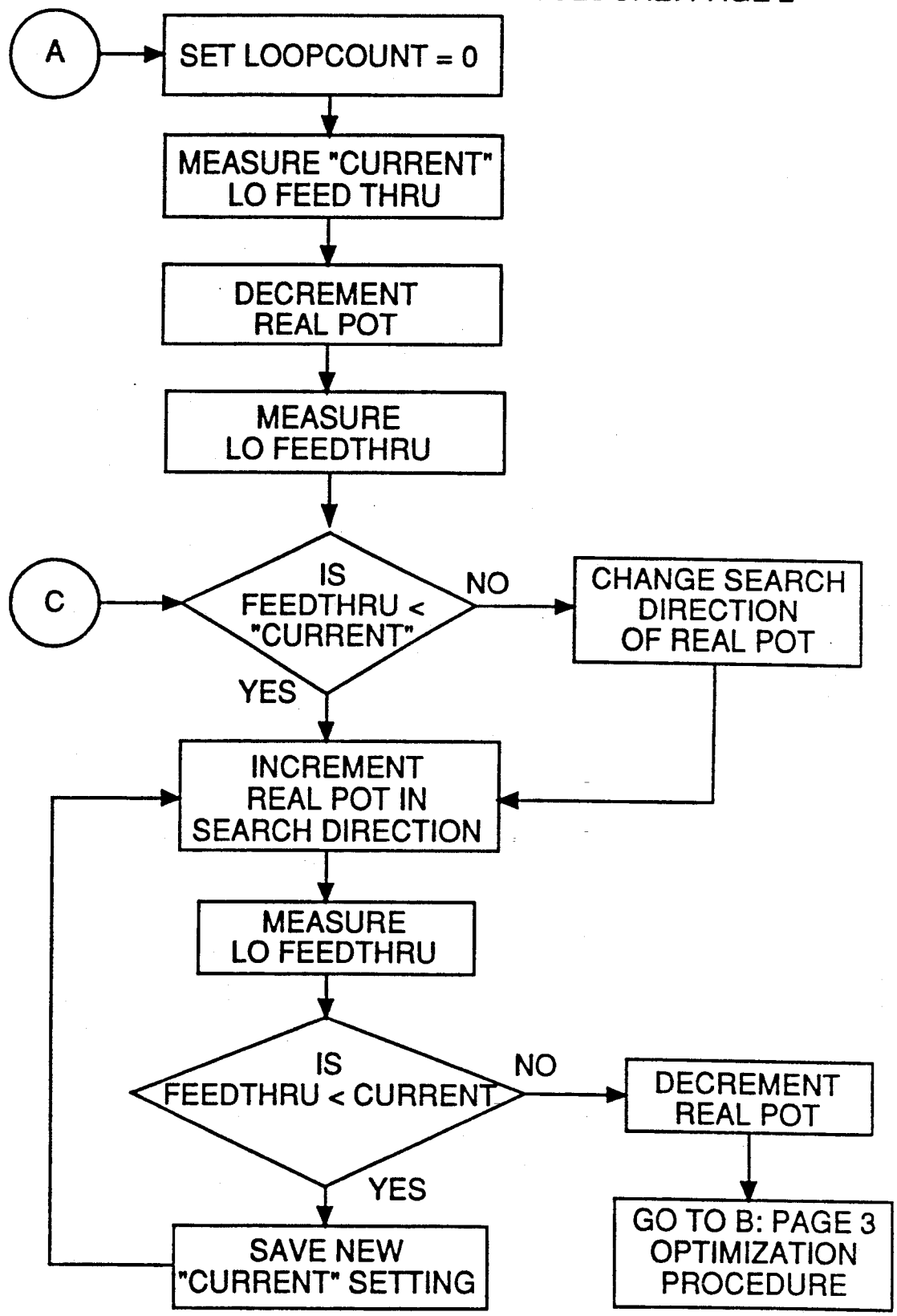

The procedure for achieving automatic nulling of the local oscillator feedthrough is depicted by the flow charts of FIGS. 9A-9C. The procedure takes place in two stages. The first stage, which occurs at power-up and is illustrated in FIG. 9A, initializes the control settings by determining their end points. A first-order null is accomplished by parking a first one of the controls at its mid-range while traversing the other, second control at all incremental values between its end points and monitoring the level of the local oscillator feedthrough signal. A datum corresponding to the best value of the second control (i.e. the value that yields the smallest local oscillator feedthrough) is stored in a memory 52. This procedure is then repeated, with the second control parked at its best value and the first control incremented throughout its range. A datum corresponding to the best value of the first control is similarly stored. Both controls are then set to their best first-order values.

The second stage of the nulling procedure, illustrated in FIGS. 9B and 9C, performs a localized optimization using the first-order values derived in the power-up stage as a starting point. This second stage of the nulling procedure may be repeated as necessary, or periodically, to maintain feedthrough performance against time and temperature variations.

The steps detailed in the flow charts find the best setting for each control incrementally. These steps repeat the procedure for finding the best setting, alternating between real and imaginary controls on successive optimizations. The procedure terminates on either of two conditions. One condition is based on the last recorded optimization yielding no change in the real and imaginary controls. Procedure termination also occurs after a maximum count of optimization loops to protect against the possibility of indefinite cycling caused by noise errors or the like.

Having described and illustrated the principles of my invention with reference to a preferred embodiment and certain variations thereof, it will be apparent that the invention can be modified in arrangement and detail without departing from such principles. For example, while the preferred procedure involves incrementing each of the first and second control signals throughout their ranges to determine the best first-order values, in other embodiments the incrementing can stop when the detected level of the local oscillator feedthrough signal stops decreasing and begins increasing. At this point, the control may be decremented once to restore the previous, "best" value.

It will further be recognized that the sensing of the local oscillator feedthrough signal can be accomplished at many points throughout the receiver architecture. In some applications, it is desirable to sense the signal in one of the last signal processing stages, rather than in an early signal processing stage. Some local oscillator feedthrough is due to imperfect local oscillator shielding, so the local oscillator signal may be parasitically coupled to many circuits throughout the receiver. By sensing the net feedthrough signal in one of the last signal processing stages, the cumulative effect of all the parasitic coupling mechanisms may also be compensated for.

In view of the wide variety of embodiments and methodologies to which the principles of my invention may be put, it should be recognized that the illustrated embodiment is exemplary only and should not be taken as limiting the scope of my invention. Rather, I claim as my invention all such embodiments and methodologies as may come within the scope and spirit of the following claims and equivalents thereto.

I claim:

1. In a method of nulling local oscillator feedthrough in a superheterodyne receiver, the receiver including a mixer driven by RF input and local oscillator signals, the receiver producing a receiver signal which includes an undesirable local oscillator component, the method including summing the receiver signal with a nulling signal derived from the local oscillator signal, said nulling signal having substantially the same amplitude and opposite phase as the undesired local oscillator component, an improvement comprising the steps:
   (a) providing an automatic control circuit;
   (b) producing from the automatic control circuit a first electrical control signal on which the nulling signal depends;
   (c) setting the first control signal to a first value;
   (d) incrementing the first control signal, and thereby changing the nulling signal;
   (e) determining whether the undesired local oscillator component is diminished by the aforesaid incrementing of the first control signal and, if so, storing a datum indicative of the value of the first control signal in an electrical memory element;
   (f) repeating steps (d) and (e) until the first control signal reaches a second value;
   (g) recalling the stored datum from the electrical memory element; and
   (h) setting the first control signal to the value indicated by said stored datum.

2. The method of claim 1 which further comprises:
   (i) providing from the automatic control circuit a second electrical control signal on which the nulling signal depends, said second control signal being different than the first;
   (j) setting the second control signal to a first value;

(k) incrementing the second control signal;

(l) determining whether the undesired local oscillator component is diminished by the aforesaid incrementing of the second control signal and, if so, storing a datum indicative of the value of the second control signal in an electrical memory element;

(m) repeating steps (k) and (l) until the second control signal reaches a second value;

(n) recalling the stored datum from the electrical memory element; and (o) setting the second control signal to the value indicated by said stored datum.

3. The method of claim 1 which further includes:

(i) providing from the automatic control circuit a second electrical control signal on which the nulling signal depends, said second control signal being different than the first;

(j) setting the second control signal to a first value;

(k) incrementing the second control signal;

(l) determining whether the undesired local oscillator component is diminished by the aforesaid incrementing of the second control signal and, if so, repeating steps (k) and (l) and, if not, discontinuing incrementing of the second control signal.

4. The method of claim 3 which further includes decrementing the second control signal if the undesired local oscillator component is not diminished by the incrementing step.

5. In a method of nulling local oscillator feedthrough in a superheterodyne receiver, the receiver including a mixer driven by RF input and local oscillator signals, the receiver producing a receiver signal which includes an undesirable local oscillator component, the method including summing the receiver signal with a nulling signal derived from the local oscillator signal, said nulling signal having substantially the same amplitude and opposite phase as the undesired local oscillator component, an improvement comprising the steps:

(a) providing an automatic control circuit;

(b) producing from the automatic control circuit a first electrical control signal on which the nulling signal depends;

(c) setting the first control signal, and thereby the nulling signal, to a first value;

(d) incrementing the first control signal, and thereby changing the nulling signal;

(e) determining whether the undesired local oscillator component is diminished by the aforesaid incrementing of the first control signal and, if so, repeating steps (d) and (e) and, if not, discontinuing incrementing of the first control signal.

6. The method of claim 5 which further includes decrementing the first control signal if the undesired local oscillator component is not diminished by the incrementing step.

7. The method of claim 5 which further comprises:

(i) providing from the automatic control circuit a second electrical control signal on which the nulling signal depends, said second control signal being different than the first;

(j) setting the second control signal to a first value;

(k) incrementing the second control signal;

(l) determining whether the undesired local oscillator component is diminished by the aforesaid incrementing of the second control signal and, if so, storing a datum indicative of the value of the second control signal in an electrical memory element;

(m) repeating steps (k) and (l) until the second control signal reaches a second value;

(n) recalling the stored datum from the electrical memory element; and (o) setting the second control signal to the value indicated by said stored datum.

8. The method of claim 5 which further includes:

(i) providing from the automatic control circuit a second electrical control signal on which the nulling signal depends, said second control signal being different than the first;

(j) setting the second control signal to a first value;

(k) incrementing the second control signal;

(l) determining whether the undesired local oscillator component is diminished by the aforesaid incrementing of the second control signal and, if so, repeating steps (k) and (l) and, if not, discontinuing incrementing of the second control signal.

9. The method of claim 8 which further includes decrementing the second control signal if the undesired local oscillator component is not diminished by the incrementing step.

10. A signal analysis instrument comprising:

means for receiving an input signal to be analyzed;

a local oscillator for producing a local oscillator signal;

a mixer for mixing the input signal with the local oscillator signal, said mixer producing an undesired local oscillator component in subsequent receiver signals;

a feed forward circuit for introducing a compensating signal into one of said subsequent receiver signals, said compensating signal having amplitude and phase characteristics causing it to cancel the undesired signal from the subsequent receiver signal;

said feed forward circuit including:

first means for sampling the subsequent receiver signal to detect the magnitude of the undesired signal therein;

second means for producing first and second control signals;

third means responsive to the first control signal for varying the amplitude of the compensating signal; and fourth means responsive to the second control signal for varying the phase of the compensating signal;

the second means further including means for automatically and iteratively changing the first and second control signals to minimize the magnitude of the undesired signal detected by the first means.

11. The signal analysis instrument of claim 10 in which:

the first means includes an analog-to-digital converter for producing a digital first signal related to the magnitude of the undesired signal in the subsequent receiver signal;

the second means includes means for producing first and second digital control signals, and digital-to-analog converter means for converting said digital control signals to analog control signals.

12. The signal analysis instrument of claim 11 in which the second means comprises a microprocessor.

13. The signal analysis instrument of claim 10 in which the third means includes a PIN diode.

14. The signal analysis instrument of claim 10 in which the fourth means includes a varactor diode.

15. In an apparatus for nulling local oscillator feedthrough in a superheterodyne receiver, the receiver including a mixer driven by a source of RF input signals and a source of local oscillator signals, the receiver producing a receiver signal which includes an undesirable local oscillator component, the apparatus including compensating means for summing the receiver signal in a post-mixer stage with a compensating signal derived from the local oscillator signal, said compensating signal having substantially the same amplitude and opposite phase as the undesired local oscillator component, an improvement wherein the compensating means has an input coupled to the source of local oscillator signals and an output coupled to the post-mixer stage and includes:

a varactor;
first means for controllably biasing the varactor to control the phase of the compensating signal;
a PIN diode;
second means for controllably biasing the PIN diode to control the amplitude of the compensating signal;
a detector for detecting the undesired local oscillator component of the receiver signal and producing a detector signal corresponding thereto; and
means for automatically controlling the first and second means in response to the detector signal.

* * * * *

UNITED STATES PATENT AND TRADEMARK OFFICE
CERTIFICATE OF CORRECTION

PATENT NO. : 5,086,512

DATED : February 4, 1992

INVENTOR(S) : Manfred U. Bartz

It is certified that error appears in the above-identified patent and that said Letters Patent is hereby corrected as shown below:

Col. 6, l. 58 - delete "$V_a$'" and insert therefor --$V_1'$--;

Signed and Sealed this

Twenty-fifth Day of April, 1995

Attest:

BRUCE LEHMAN

Attesting Officer

Commissioner of Patents and Trademarks